United States Patent
Lee

(10) Patent No.: US 8,879,601 B1
(45) Date of Patent: Nov. 4, 2014

(54) MULTI-WAVELENGTH LASER DIODE MODULE

(71) Applicant: Ytel Photonics Inc., Gwangju (KR)

(72) Inventor: Yong Tak Lee, Gwangju (KR)

(73) Assignee: Ytel Photonics Inc., Gwangju (KR)

( * ) Notice: Subject to any disclaimer, the term of this patent is extended or adjusted under 35 U.S.C. 154(b) by 0 days.

(21) Appl. No.: 14/070,012

(22) Filed: Nov. 1, 2013

(30) Foreign Application Priority Data

Aug. 29, 2013 (KR) .................. 10-2013-0102956

(51) Int. Cl.
 H01S 5/00 (2006.01)
 H01S 5/40 (2006.01)
 H01S 5/026 (2006.01)
(52) U.S. Cl.
 CPC ............. *H01S 5/4087* (2013.01); *H01S 5/0268* (2013.01)
 USPC ............. 372/50.121; 372/50.11; 372/50.1
(58) Field of Classification Search
 USPC ................... 372/50.121, 50.11, 50.1
 See application file for complete search history.

(56) References Cited

U.S. PATENT DOCUMENTS

| 2004/0125833 A1* | 7/2004 | Sarlet et al. ...................... 372/20 |
| 2006/0013273 A1* | 1/2006 | Menon et al. ................... 372/32 |
| 2013/0148345 A1* | 6/2013 | Yabe ............................. 362/231 |

* cited by examiner

*Primary Examiner* — Kinam Park
(74) *Attorney, Agent, or Firm* — Osha Liang LLP

(57) ABSTRACT

Provided is a multi-wavelength laser diode module including a plurality of laser diodes having different consecutive light emission wavelength regions, a plurality of filters respectively corresponding to the plurality of laser diodes, and an optical waveguide path that transmits light emitted from the plurality of laser diodes to the plurality of filters and collects light reflected or transmitted by the plurality of filters to transmit the collected light to the outside.

9 Claims, 5 Drawing Sheets

MULTI-WAVELENGTH LASER DIODE MODULE

CROSS-REFERENCE TO RELATED APPLICATION

This application claims priority to and the benefit of Korean Patent Application No. 2013-0102956, filed on Aug. 29, 2013, the disclosure of which is incorporated herein by reference in its entirety.

BACKGROUND

1. Field of the Invention

The invention relates to a multi-wavelength laser diode module in which laser diodes having different wavelengths are modularized to provide a single output.

2. Discussion of Related Art

In general, technology for configuring a plurality of laser diodes to be integrated into a single package has been developed in response to need for high power, multiple wavelengths, and the like. For example, a technique of integrating and packaging laser diodes having the same wavelength band into one-dimensional and two-dimensional arrays, or a technique of integrating a plurality of laser diodes having different wavelengths together, has been used in various application fields such as multi-channel communications, laser printers, etc.

However, progress in industry is accompanied by increasing demand in fields of medicine, industry, and the like for a greater number of laser wavelengths and high power at a low cost.

SUMMARY OF THE INVENTION

The invention is provided to address the above needs, and an object of the invention is to provide, at a low cost, a high-power and multi-wavelength laser diode module having a greater number of laser wavelengths.

According to a first aspect of the invention, there is provided a multi-wavelength laser diode module including: a plurality of laser diodes having different consecutive light emission wavelength regions; a plurality of filters respectively corresponding to the plurality of laser diodes; and an optical waveguide path that transmits light emitted from the plurality of laser diodes to the plurality of filters and collects light reflected or transmitted by the plurality of filters to transmit the collected light to the outside.

Here, each of the plurality of filters may reflect light of a wavelength emitted by a corresponding laser diode and transmit light of other wavelengths.

Further, each of the laser diodes may be further provided with a metal resistance heating element for temperature regulation. Also, a groove in which an optical fiber can be safely seated may be formed in one end of the optical waveguide path.

Further, the plurality of laser diodes may be formed on a first substrate, and the plurality of filters and the optical waveguide path may be formed on a second substrate disposed on one side of an upper portion of the first substrate.

Meanwhile, the optical waveguide path may receive light from the plurality of laser diodes through a side of the second substrate.

In accordance with the invention, the plurality of laser diodes and the plurality of filters are connected to each other through the optical waveguide path, thereby enabling a greater number of lasers having different wavelengths to be integrated and a multi-wavelength laser diode module to be manufactured at a low cost.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, an embodiment of the invention will be described with reference to the accompanying drawings. However, the following exemplary embodiment may be modified in various ways and should in no way be construed as limiting the scope of the invention. The following embodiment is described in detail to enable those of ordinary skill in the art to embody and practice the invention.

Figure 1:
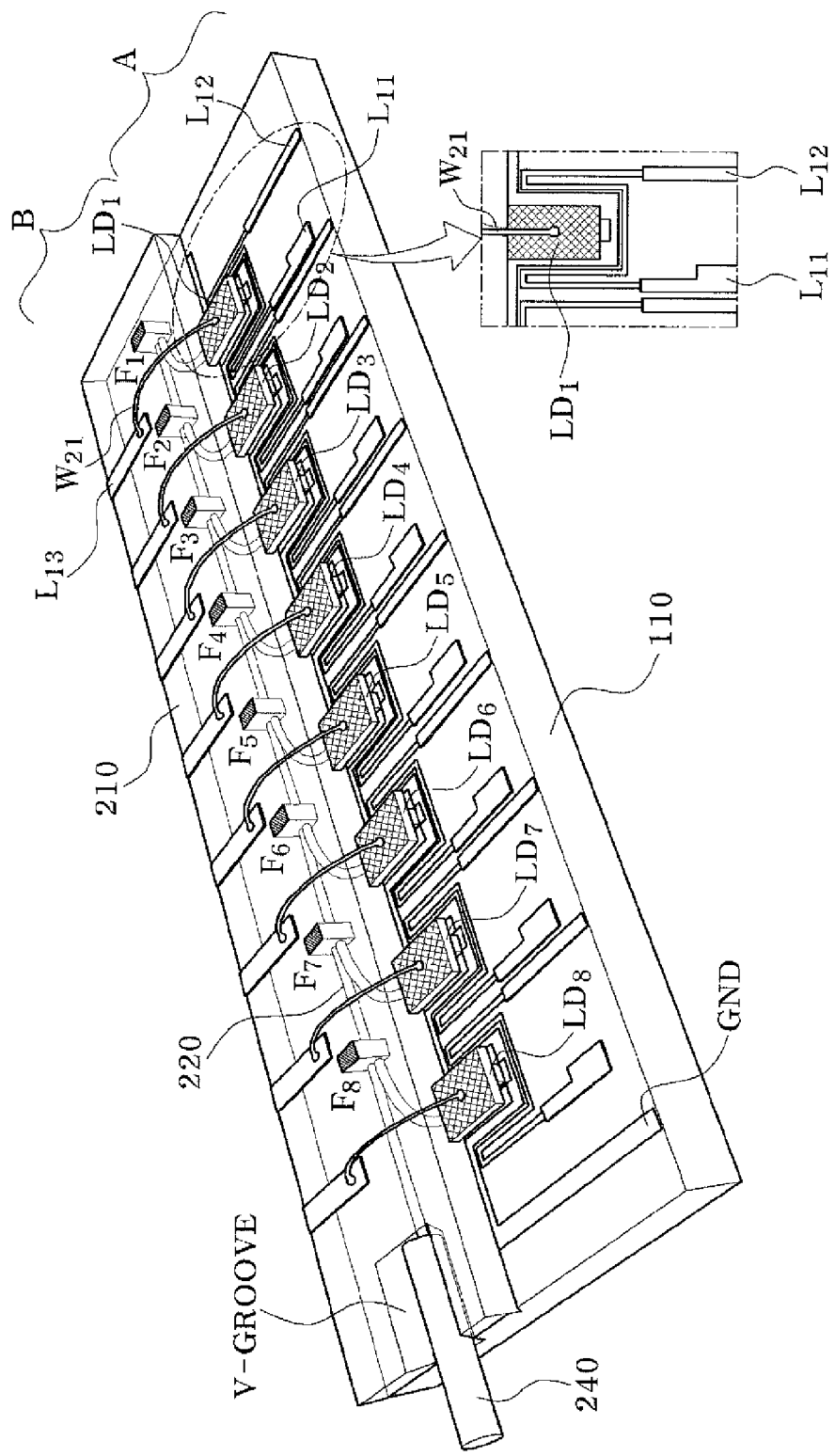
FIG. 1 is a configuration diagram for describing a multi-wavelength laser diode module according to an embodiment of the invention.

FIG. 1 is a configuration diagram for describing a multi-wavelength laser diode module according to an embodiment of the invention.

The multi-wavelength laser diode module according to the embodiment is configured of a substrate 110, a plurality of laser diodes $LD_1$ to $LD_8$, a plurality of filters $F_1$ to $F_8$, electrodes $L_{11}$, $L_{12}$, $L_{13}$, ..., $L_{18}$, $L_{28}$, and $L_{38}$ for applying a current into each laser diode, and an optical waveguide path 220.

The multi-wavelength laser diode module is divided into a region A in which the plurality of laser diodes $LD_1$ to $LD_8$ are arranged, and a region B in which the plurality of filters $F_1$ to $F_8$ are formed on the substrate 110. The region A in which the plurality of laser diodes $LD_1$ to $LD_8$ are disposed is formed just on the substrate 110, and the region B in which the optical waveguide path 220 and the plurality of filters $F_1$ to $F_8$ are formed has a form in which a step is disposed on an upper portion of a substrate 210 in order to effectively connect light emitted from the laser diodes to the optical waveguide path 220. Preferably, the substrate 110 is made of a silicon substrate or a silica substrate, and the substrate 210 is made of silica.

The plurality of laser diodes $LD_1$ to $LD_8$ emit light having different consecutive wavelengths. That is, the laser diodes $LD_1$ to $LD_8$ respectively emit light having a shortest wavelength $\lambda_1$ to a longest wavelength $\lambda_8$. An applicable laser diode is not particularly limited, but a single wavelength laser is preferable and a distributed feedback (DFB) laser is a representative example. For example, $\lambda_1$ to $\lambda_8$ may be 1350 nm, 1400 nm, 1450 nm, 1500 nm, 1580 nm, 1650 nm, 1700 nm, and 1780 nm, respectively.

One laser diode, $LD_1$, of the plurality of laser diodes $LD_1$ to $LD_8$, will be described in detail. The other laser diodes all have the same structure as $LD_1$. As the laser diode $LD_1$, a laser diode in which electrodes are formed on a lower portion and an upper portion is illustrated as an example, but the structure of the laser diode is not limited thereto. Further, according to this laser diode $LD_1$, electrodes GND, $L_{11}$, and $L_{12}$ are formed on the substrate 110, and an upper portion of the electrodes has a structure for connection by, for example, flip-chip bonding. The entire ground electrode GND of the substrate 110 is formed outside of the laser diodes $LD_1$ to $LD_8$ and extended in order to be connected to a flip-chip bonding site. Further, N electrodes for applying a current are formed on an upper portion of the laser diode $LD_1$ and connected to N electrodes $L_{13}$ on the substrate by a metal wire $W_{21}$. The laser diode $LD_1$ is configured so that a current from the outside is applied between the N electrodes and ground electrodes.

FIG. 1 contains a close-up view of the laser diode $LD_1$. In each laser diode, in addition to the ground electrode and N electrode, other electrodes $L_{11}$ and $L_{12}$ are formed. The electrodes $L_{11}$ and $L_{12}$ are electrodes of a resistance heating element for applying heat to the laser diode to regulate a wavelength, and are made of a metal such as chrome or tungsten, for example. The resistance heating element is located at a side or a lower portion of the laser diode and is preferably able to rapidly increase temperature even by a small current. When the electrodes $L_{11}$ and $L_{12}$ for temperature regulation are supplied with a current from the outside, the resistance heating element generates heat depending on the magnitude of the supplied current, and by regulating temperature, the wavelength of the laser diode can be regulated. Meanwhile, it may be convenient for one of the electrodes $L_{11}$ and $L_{12}$ to be connected to the ground electrode GND.

A method of manufacturing the laser diodes $LD_1$ to $LD_8$ on the substrate 110 can be achieved using semiconductor processes such as crystal growth and photolithography, which are already well known. Therefore, a description thereof will be omitted.

Next, the optical waveguide path 220 and the plurality of filters $F_1$ to $F_8$ which are formed on the substrate 210 will be described.

The substrate 210 is configured of a material such as silica enabling an optical waveguide path to be formed by difference of reflectivity. The optical waveguide path 220 is formed of a material having high reflectivity. The optical waveguide path 220 may be formed in various ways without limitation. For example, a groove is formed in a silica substrate that can be used as cladding and filled with a core material having high reflectivity. Thereafter, the entire upper portion including the inside of the groove is coated with the core material and chemical mechanical polishing (CMP) or the like is performed so that the core material is left only inside of the groove. Thereafter, the silica material which is the cladding material is covered thereon so that the structure can function like an optical waveguide path.

Meanwhile, the plurality of filters $F_1$ to $F_5$ may use bandpass filters which are manufactured in advance. However, the bandpass wavelength regions of the filters are different from each other. The filters may be configured such that the filter $F_1$ reflects $\lambda_1$, the filter $F_2$ transmits $\lambda_1$ and reflects $\lambda_2$, the filter $F_3$ transmits $\lambda_1$~$\lambda_2$ and reflects $\lambda_3$, the filter $F_4$ transmits and reflects $\lambda_1$~$\lambda_3$ and reflects $\lambda_4$, the filter $F_5$ transmits $\lambda_1$~$\lambda_4$ and reflects $\lambda_5$, the filter $F_6$ transmits $\lambda_1$~$\lambda_5$ and reflects $\lambda_6$, the filter $F_7$ transmits $\lambda_1$~$\lambda_6$ and reflects $\lambda_7$, and the filter $F_8$ transmits $\lambda_1$~$\lambda_7$ and reflects $\lambda_8$.

The filters may be formed to have a structure in which, for example, several tens of pairs of SiO2/SiNx are alternately laminated, and by regulating their thicknesses, the wavelength band which is transmitted can be regulated. An example of this is illustrated in FIG. 3A to FIG. 3C.

Figure 2:
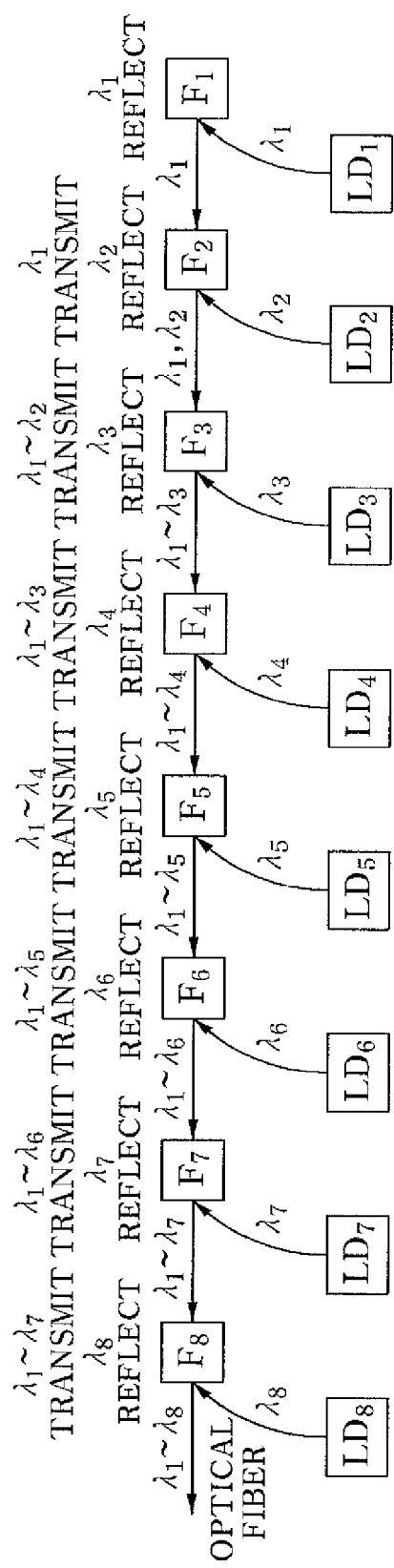
FIG. 2 is a conceptual diagram for describing a basic principle of a multi-wavelength laser array apparatus.

Further, the light emitted from the plurality of laser diodes $LD_1$ to $LD_8$ is collimated into one direction through the plurality of filters $F_1$ to $F_8$, as illustrated in FIG. 1 and FIG. 2. In order for the collimated light to enter an optical fiber 240, a V-groove is formed in one end of the substrate 210, and the optical fiber 240 is safely mounted inside the groove so that an optical axis is aligned with the optical waveguide path 220. The V-groove may be formed in one end of the substrate 210 using an etching process.

FIG. 2 is a conceptual view for describing a basic principle of a multi-wavelength laser array apparatus according to the invention.

Referring to FIG. 2, functions performed by the plurality of laser diodes $LD_1$ to $LD_8$ and the plurality of filters $F_1$ to $F_8$ with respect to specific wavelengths are illustrated. That is, the laser diodes $LD_1$ to $LD_8$ are disposed to emit light of the shortest wavelength $\lambda_1$ to the longest wavelength $\lambda_8$, respectively.

Figure 3:
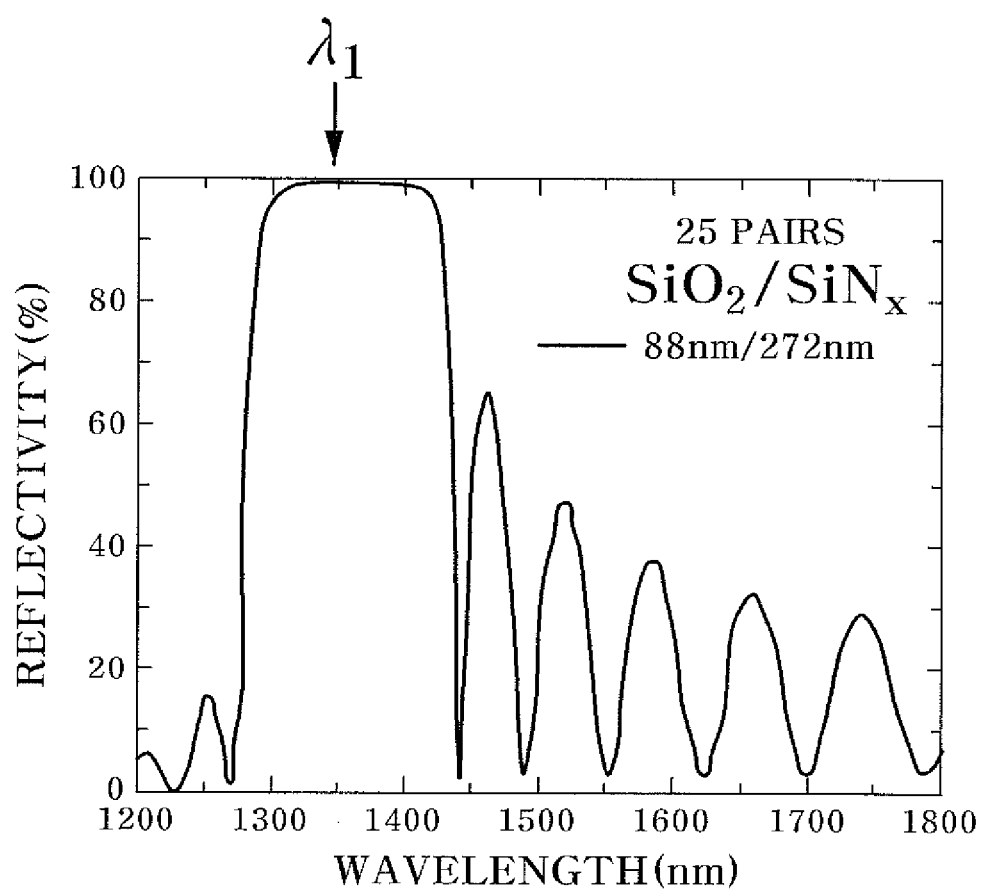
FIG. 3 to FIG. 5 are graphs showing reflectivity according to exemplary wavelengths of a plurality of filters $F_1$ to $F_8$ of the invention.
Figure 4:
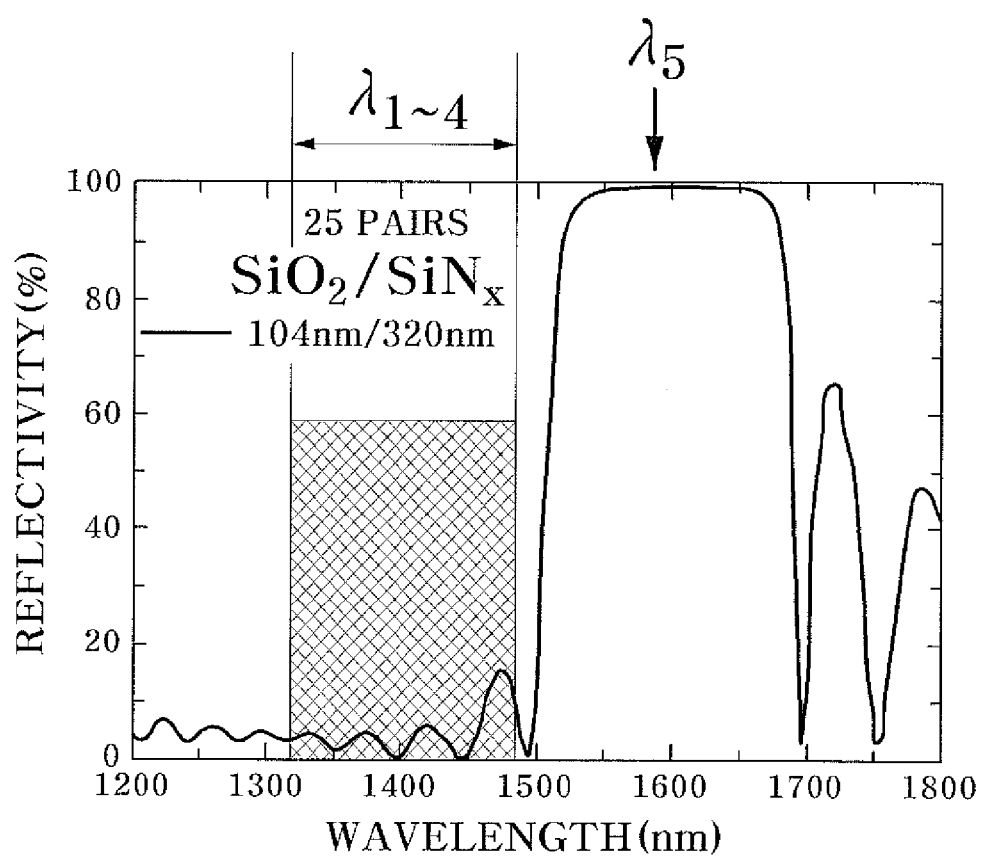
Figure 5:
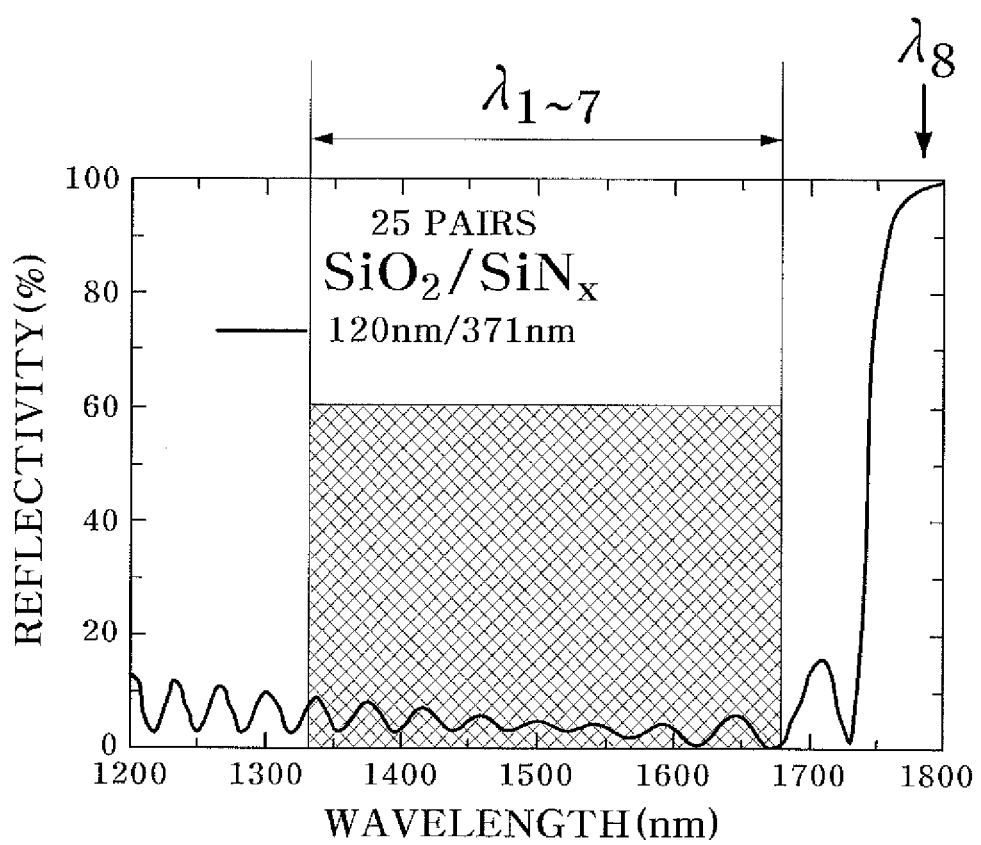

FIGS. 3 to 5 are graphs showing reflectivity results according to exemplary wavelengths of the plurality of filters $F_1$ to $F_8$ of the invention.

In an example, the filter $F_1$ has high reflectivity in a region of $\lambda_1$, as illustrated in FIG. 3. In the filter $F_1$, 25 alternating SiO2/SiNx (88 nm/272 nm) layers may be laminated.

Referring to FIG. 4, the filter $F_5$ may be configured to transmit $\lambda_1$~$\lambda_4$ and reflect $\lambda_5$, and may be formed by laminating 25 alternating SiO2/SiNx (104 nm/320 nm) layers. Further, referring to FIG. 5, the filter $F_8$ may be configured to transmit $\lambda_1$~$\lambda_7$ and reflect $\lambda_8$, and may be formed by laminating 25 alternating SiO2/SiNx (1209 inn/371 nm) layers.

The plurality of filters $F_1$ to $F_8$ may be formed such that a gap is formed by etching the upper portion of the substrate 210 on which the optical waveguide path 220 is formed so that the filters can be inserted along an optical path. When the substrate 210 is made of silica, the etching is normally performed using photolithography and dry etching.

Further, on the upper portion of the substrate 210, the electrode $L_{13}$ for applying a current to the diode $LD_1$ is formed of a conductive material such as metal.

Meanwhile, light emitted from the plurality of laser diodes $LD_1$ to $LD_8$ is collimated into one direction through the plurality of filters $F_1$ to $F_8$, as illustrated in FIG. 1 and FIG. 2, and the collimated light enters the optical fiber 240.

Meanwhile, the multi-wavelength laser diode module of the invention may have various applications without particular limitation. In particular, the multi-wavelength laser diode module may be applied to the fields of medicine and sensors. For example, the multi-wavelength laser diode module may be configured to emit light having eight different wavelengths in order to irradiate blood, skin, and other organs and tissues of humans and other animals. The light used in irradiation can be used for medical treatment, and light transmitted or reflected from an irradiated target can be analyzed to aid in the diagnosis of diseases, detection of drugs, and various other medical purposes.

What is claimed is:

1. A multi-wavelength laser diode module comprising:
   a plurality of laser diodes having different consecutive light emission wavelength regions;
   a plurality of filters respectively corresponding to the plurality of laser diodes; and
   an optical waveguide path that transmits light emitted from the plurality of laser diodes to the plurality of filters, and collects light reflected or transmitted by the plurality of filters to transmit the collected light to the outside.

2. The multi-wavelength laser diode module according to claim 1, wherein each of the plurality of filters reflects light of a wavelength emitted by a corresponding laser diode and transmits light of other wavelengths.

3. The multi-wavelength laser diode module according to claim 1, wherein each of the laser diodes is further provided with a metal resistance heating element for temperature regulation.

4. The multi-wavelength laser diode module according to claim 1, wherein a groove in which an optical fiber is safely seated is formed in one end of the optical waveguide path.

5. The multi-wavelength laser diode module according to claim 1, wherein the plurality of laser diodes are formed on a first substrate, and the plurality of filters and the optical waveguide path are formed on a second substrate disposed on one side of an upper portion of the first substrate.

6. The multi-wavelength laser diode module according to claim 4, wherein the first substrate is a silicon or silica substrate, and the second substrate is a silica substrate.

7. The multi-wavelength laser diode module according to claim 1, wherein the optical waveguide path receives light from the plurality of laser diodes through a side of the second substrate.

8. The multi-wavelength laser diode module according to claim 3, wherein the resistance heating element for temperature regulation of the plurality of laser diodes is located at a side of the laser diodes.

9. The multi-wavelength laser diode module according to claim 3, wherein the resistance heating element for temperature regulation of the plurality of laser diodes is located at a lower portion of the laser diodes.

\* \* \* \* \*